United States Patent [19]

Barthold

[11] 4,042,844

[45] Aug. 16, 1977

[54] POWER TRANSISTOR SWITCH

[76] Inventor: Fred O. Barthold, 1410 B Hygeia, Leucadia, Calif. 92024

[21] Appl. No.: 678,239

[22] Filed: Apr. 19, 1976

[51] Int. Cl.² ............................................. H03K 3/45
[52] U.S. Cl. ................................... 307/314; 307/254; 307/270
[58] Field of Search ................ 307/202, 254, 314, 270

[56] References Cited

U.S. PATENT DOCUMENTS

| | | | |
|---|---|---|---|
| 3,054,066 | 9/1962 | Crane | 307/314 |
| 3,291,999 | 12/1966 | Lipman | 307/314 |
| 3,487,315 | 12/1969 | Parham | 307/314 |

*Primary Examiner*—Stanley D. Miller, Jr.
*Assistant Examiner*—B. P. Davis
*Attorney, Agent, or Firm*—Frank D. Gilliam

[57] ABSTRACT

A power transistor switch for switching high-amperage, direct-current through a low forward impedance, consisting of a transformer which couples a control pulse through separate multifilar secondary windings to each base element of a plurality of transistors. The utilization of multiple junction transistor geometry results in a rapid transition, i.e., low transition time consistent with a low forward impedance and cost savings because of the inherent economies in multiple junction transistors, without resort to individual discrete emitter or base resistances with the power loss inherent in their use.

5 Claims, 3 Drawing Figures

Fig. 1
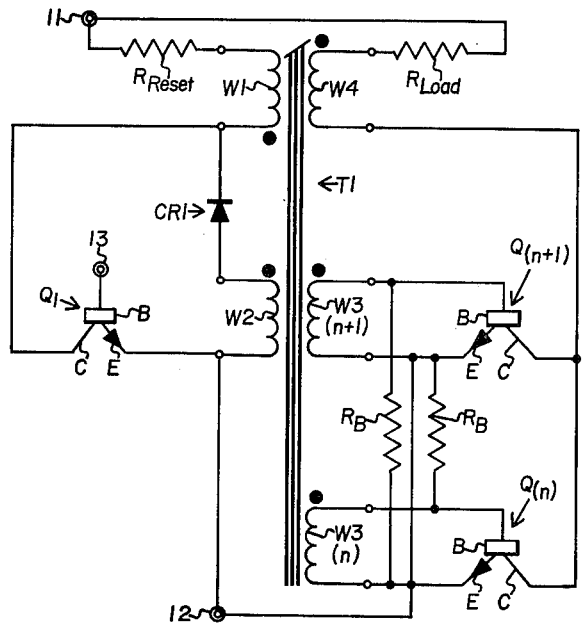
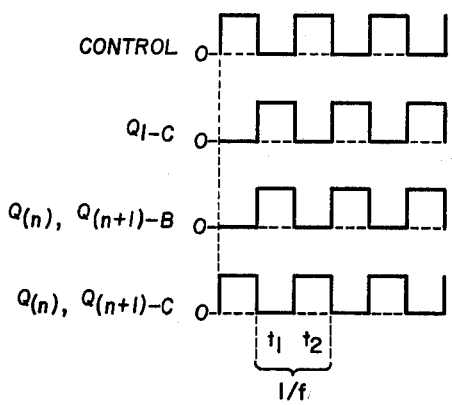
Fig. 2
Fig. 3
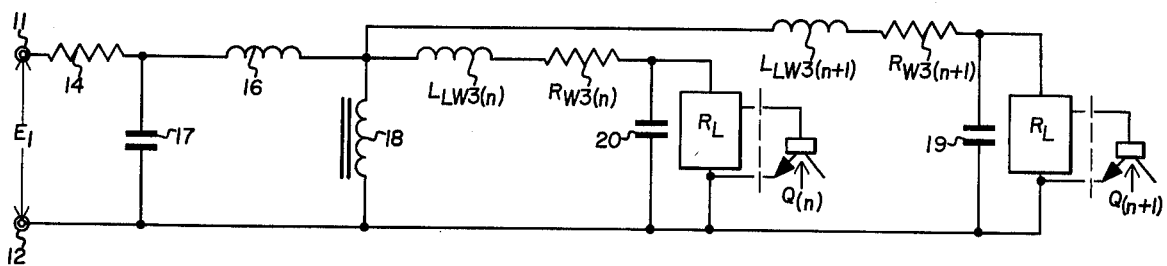

POWER TRANSISTOR SWITCH

BACKGROUND OF THE INVENTION

Where load requirements dictate the switching of highamperage, direct-current (such as in welding operations, etc.) prior art methods have been found to be either extremely expensive or generally unsatisfactory. The utilization of extremely high-current transistors is, of course, expensive and prior art paralleling techniques heretofore have resorted to individual discrete emitter or base resistances with the power losses inherent in their utilization. The general problem involved in paralleling transistors is the result of the broad parametric range of junction characteristics, which in turn, results in failure to share load current during turn-on, on-state (saturation), and turn-off, which in turn, causes destruction of the junction.

Another scheme in limited use lies in the selection of power transistors with matched parameters. The problems encountered here lie in replacement situations, parameter variations because of aging, and relatively high initial costs.

BRIEF DESCRIPTION OF THE INVENTION

The present invention relates to a power transistor switch, and, more particularly, to a power transistor switch utilizing transistor paralleling.

According to the invention, a power transistor switch is provided in which a plurality of transistors are paralleled without resort to individual discrete emitter or base resistances and their attendant power loss. A hybrid saturable core transformer is utilized for coupling, switching signals to the bases of the paralleled transistors. The transformer has a reset and turn-on primary winding, a turn-off primary winding, and a plurality of separate secondary windings, each coupled between a separate transistor's base and emitters together with a regenerative secondary winding for current feedback, in series with the transistor collectors and the load. The plurality of secondary windings are multifilar wound to insure identical switching drive to each transistor.

The utilization of transistors in parallel has several advantages. There is inherently a low forward impedance together with low transition time in multiple junction transistor geometry. These types of transistors are, of course, very inexpensive compared to the heavy current-handling, high-junction area transistors that the instant technique is designed to replace.

The paralleling technique employed results in a much less expensive, high-amperage current switch together with economies in space and weight as will be appreciated by those skilled in the art with reference to the detailed discussion below.

An object of the present invention is the provision of a high-amperage, direct-current transistor switch.

A further object of the invention is the provision of a high-amperage, direct-current switch having a low forward impedance.

Another object of the invention is the provision of a high-amperage, direct-current switch having a rapid transition time.

Still another object of the invention is the provision of a high-amperage, direct-current switch utilizing low-loss paralleling of transistors.

Yet another object of the invention is the provision of a high-amperage, direct-current switch which is extremely efficient.

A still further object of the invention is the provision of a high-amperage, direct-current switch which is extremely inexpensive.

Other objects and many of the attendant advantages of the present invention will be readily appreciated as the same becomes better understood by reference to the following detailed description when considered in connection with the accompanying drawings in which like reference numerals designate like parts throughout the Figures thereon and wherein:

FIG. 1 is a schematic diagram of the preferred embodiment of the present invention;

FIG. 2 is a series of wave forms taken at various points throughout the embodiment of FIG. 1; and FIG. 3 is a schematic diagram of the equivalent circuit of the embodiment of FIG. 1.

DETAILED DESCRIPTION OF THE DRAWINGS

Referring to FIG. 1, an input voltage is applied across terminals 11 and 12 (12 being the common terminal) and a control signal is applied at input terminal 13 which is connected to the base element B of transistor $Q_1$. Common terminal 12 is coupled to emitter E of transistor $Q_1$ and to one end of winding W2 of transformer T1. Common terminal 12 is also coupled to one end of windings W3 $(n + 1)$ and W3 (n) and to emitters E of transistors Q (n) and Q $(n + 1)$. Incoming voltage terminal 11 is coupled through $R_{reset}$ to one end of winding W1 of transformer T1 and collector C of transistor $Q_1$ and the cathode of diode CR1. The anode of diode CR1 is coupled to another end of winding W2 of transformer T1. Incoming voltage terminal 11 is also coupled through resistance $R_{load}$ and winding W4 of transformer T1 in series to collectors C of transistors $Q_{(n + 1)}$ and $Q_{(n)}$.

Referring to FIG. 2, four square waves are illustrated in timed relationship, which are labeled control, $Q_{1-C}$, $Q_{(n)}$, $Q_{(n + 1)}$, and -B; $Q_{(n)}$, $Q_{(n + 1)}$, -C with times T1 and T2 indicated at $1/f$.

Referring to FIG. 3, an equivalent circuit is shown with incoming voltage terminals 11 and 12, 12 being common terminal. Voltage at terminal 11 is coupled through lumped constant resistance 14 and lumped constant inductance 16 to inductances $L_L$, $W_{3n + 1}$ and $L_L$ for W3N resistance $R_{W3n + 1}$ to one side of $R_L Q_{(n)}$ the other side of which is connected to terminal 12. Lumped inductance 16 is also coupled through inductance $L_{LW3n}$ and resistance $R_{W3n}$ to one side of $R_L Q_{(n)}$, the other side of which is coupled to common terminal 12. Lumped capacitance 17 is shown connected to the junction of lumped resistance 14 and lumped conductance 16 to common terminal 12 and lumped inductance 18 is shown coupled between the junction of lumped inductance 16 and $L_{LW3(n)}$ to common terminal 12. Lumped capacitances 19 and 20 are shown coupled across $R_L Q_{(n\ 1)}$ and $R_{LQN}$, respectively.

OPERATION

Referring to FIG. 1, quiescently with transistor Q1 cut off at zero base current, transistors $Q_{(n)}$ and $Q_{(n + 1)}$ are in a cut off condition. When a forward bias is applied at terminal 13 to the base of transistor Q1, transistor Q1 turns on and the core of the transformer is saturated due to the current through winding W1. The phasing of the primary and secondary windings of the transformer result in an initial negative charge being inductably coupled to the bases of transistors $Q_{(n)}$ and $Q_{(n + 1)}$, which hold transistors $Q_{(n)}$ and $Q_{(n + 1)}$ cut off.

When at time T1 (FIG. 2) the voltage at control point 13 is dropped to zero cutting off collector current in transistor Q1 and current through primary winding W1.

At this time, the core of transformer T1 reverts to an unsaturated condition and a positive square wave is applied to the bases of transistors $Q_{(n)}$ and $Q_{(n+1)}$ turning them on.

Current then flows from common terminal 12 through the emitter base of transistors $Q_{(n)}$ and $Q_{(n+1)}$ parallel and through secondary winding W4 of transformer T1 and resistance $R_{load}$ to positive terminal 11. The phasing of secondary winding W4 as indicated maintains a positive voltage through inductive coupling to multifilar windings $W3_{(n)}$ and $W3_{(n+1)}$ to the bases of transistors $Q_{(n)}$ and $Q_{(n+1)}$, which in turn, maintains collector current through resistance $R_{load}$. When control point 13 is driven positive, collector current again flows in transistor $Q_1$ through primary winding W1 of transformer T1, the transformer again returns the bases of transistors $Q_{(n)}$ and $Q_{(n+1)}$ to zero, cutting off their collector currents.

Energy stored in the base emitter junctions of transistors $Q_N$ and $Q_{N+1}$ then drives reverse current through these junctions resulting in a positive potential at the top of primary winding W2 and since $Q_1$ is conducting, primary winding W2 is effectively short-circuited through diode CR1. This removes all base current from transistors $Q_{(n)}$ and $Q_{(n+1)}$ and effects an extremely positive control in switching their collector currents to an off position. Hence, primary winding W1 can be considered a turn-on winding, and secondary winding W4 can be considered a sustaining winding being polarized for regenerative feedback to secondary windings W3(n) and W3(n + 1).

Winding W2 can bw considered a switch-off winding. Winding W3N and W3N + 1 indicate that any practical number of transistors can be paralleled, each having their own separate control winding with all of the control windings fabricated in a multifilar fashion. This is to insure that the parameters of transformer T1 as seen by the secondary switching windings will be as identical as possible and all of the paralleled transistors will be turned on and off simultaneously.

It can also be appreciated that redundancy is achieved by the very nature of paralleling techniques, i.e., should one of the parallel power transistors fail, a proportional drop in load current will be the only result instead of further component failures that can happen in other paralleling techniques.

The design equations for transformer T1 are as follows:

1. $$N_{W3} = \frac{3.49 \times 1.1 \times V_{EB}(QN) \times 10^6}{A_C \times B_{AC}sat \times f}$$

2. $N_{W2} > 10 N_{W3}$

3. $$N_{W4} = \frac{N_{W3}}{\text{saturation beta } Q_{(N)}}$$

4. $$N_{W1} = \frac{E_{in} \times N_{W3} \times 0.8}{V_{EB}(Q_{(N)})}$$

Where: $A_C$ = cross-sectional area T1 (in²)

$$f = \frac{1}{t_1 + t_2}$$

$t_1 = t_{on} = t_2 = t_{off}$ $$L_{W3} > \frac{V_{EBQ_{(N)}} \times t_1}{0.1 \times I_{B1}}$$

$L_{LW3} < L_{W3} \times 10^{-3}$

A typical design is as follows:

Assume that transistor Q1 is a commercial-type 2N3055, transistors $Q_{(n)}$ and $Q_{n+1}$ are commercial-type 2N3771, and the result at terminal 11 is 24 volts DC, $R_{reset}$ is 250 ohms and $R_{load}$ is 2.4 ohms. The transformer windings have the following parameters:

Winding W2—12.5 volts with 255.5 turns; Winding W1—15 volts with 300.5 turns; Winding W3—1.25 volts with 25.5 turns; Winding W4—0.125 volts with 2.5 turns.

This will result in a collector current of 10 amps in each of the paralleled transistors, i.e., in the case of 10 parallel transistors, the current through resistance $R_{load}$ would be 100 amps.

The above data is further assuming that the on-time is equal to or less than 0.85 of the off-time, i.e., $t_{on}$ is equal to or less than 0.85 $t_{off}$.

It should be noted that the parallel technique described above is typically operated in a saturated mode but it can operate in an unsaturated switching mode as will be appreciated by those skilled in the art.

Referring to FIG. 3, the functional understanding of this parallel transistor drive depends on examination of transformer equivalent circuit geometry, particularly in the highfrequency mode. Since relatively brief time intervals are desired properties for transition mode parameters (typically in the sub-microsecond region), it can be seen that the leakage reactance components ($L_1$) will be effective in equal distribution of energy to $R_{L1}$, in this case the emitter-base junctions of the transistors. Insofar as the transformer may be considered a bilateral device, it is evident that these leakage reactance components will be effective in both source and sink modes, i.e., during turn-on or turn-off transition modes. Initial selection of the absolute value of $L_L$ is determined by transistor parameters, and is subsequently attained by resort to ordinary transformer design practice (see Fortesque). Multifilar winding techniques insure close matching of both $L_L$ and R values (typically ± 10%), thus maintaining shared parameters within this range. During static on-state conditions, the R values are instrumental in the sharing process, in combination with the characteristic load-line properties of major junction area silicon transistors. Fundamental transformer characteristics, i.e., $E_1 = E_2$ if $N_1 = N_2$, contribute substantially.

It is worth noting that true redundancy is achieved, in that no possible failure mode of $Q_{(n)}$ will, in and of itself, result in $Q_{(n+1)}$ malfunction, provided that "out-of-saturation" operation is a precluded mode.

It should be understood, of course, that the foregoing disclosure relates to only a preferred embodiment of the invention, and that it is intended to cover all changes and modifications of the example of the invention herein chosen, for the purposes of the disclosure, which do not constitute departures from the spirit and scope of the invention.

The invention claimed is:
1. A power transistor switch comprising:
   a plurality of power transistors, each of said plurality of power transistors having an emitter element, a base element, and a collector element, all of said emitter elements and collector elements being connected together effecting a paralleling of collector currents; and a transformer having a pllurality of secondary windings and at least one primary winding, each of said secondary windings being multifilar wound in the same voltage phase relationship, having substantially the same electrical characteristics and coupled directly across separate base and emitter elements of a separate one of said plurality of transistors for simultaneously providing a base drive signal of substantially the same amplitude thereto, said at least one primary winding being coupled to a switching signal.

2. The power transistor switch of claim 1 and further including:
   a secondary feedback winding phased for regenerative feedback in said plurality of said secondary windings.

3. The power transistor switch of claim 1 and further including:
   a primary feedback winding phased for degenerative feedback to said plurality of secondary windings.

4. The invention as defined in claim 1, wherein said at least one primary winding has an opposite voltage phase relationship as said plurality of secondary windings.

5. The invention as defined in claim 1, wherein said transformer has a core saturable in one mode.

* * * * *